US010659195B2

(12) United States Patent
Zheng et al.

(10) Patent No.: US 10,659,195 B2
(45) Date of Patent: May 19, 2020

(54) INFORMATION PROCESSING METHOD, DEVICE, AND COMMUNICATIONS SYSTEM

(71) Applicant: HUAWEI TECHNOLOGIES CO., LTD., Shenzhen, Guangdong (CN)

(72) Inventors: Chen Zheng, Shanghai (CN); Liang Ma, Shanghai (CN); Jie Xiong, Shanghai (CN); Xin Zeng, Shenzhen (CN); Xiaojian Liu, Shenzhen (CN); Yuejun Wei, Shanghai (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/262,921

(22) Filed: Jan. 31, 2019

(65) Prior Publication Data
US 2019/0173499 A1 Jun. 6, 2019

Related U.S. Application Data

(63) Continuation of application No. PCT/CN2018/071643, filed on Jan. 5, 2018.

(30) Foreign Application Priority Data
Jan. 5, 2017 (CN) .......................... 2017 1 0008135

(51) Int. Cl.
*H04L 1/00* (2006.01)
*H03M 13/00* (2006.01)
(Continued)

(52) U.S. Cl.
CPC .......... *H04L 1/0067* (2013.01); *H03M 13/09* (2013.01); *H03M 13/1148* (2013.01);
(Continued)

(58) Field of Classification Search
CPC ..................................................... H04L 1/0067
See application file for complete search history.

(56) References Cited

U.S. PATENT DOCUMENTS

| | | | | |
|---|---|---|---|---|
| 6,868,075 B1* | 3/2005 | Narvinger | ............. | H04L 1/0068 370/335 |
| 6,904,290 B1* | 6/2005 | Palenius | ............. | H04W 52/265 455/422.1 |

(Continued)

FOREIGN PATENT DOCUMENTS

| | | |
|---|---|---|
| CN | 101159514 A | 4/2008 |
| CN | 101667884 A | 3/2010 |

(Continued)

OTHER PUBLICATIONS

Gallager R G. "Low-density parity-check codes". Information Theory, IRE Transactions on, 1962, pp. 21-28.
(Continued)

*Primary Examiner* — Joseph D Torres
(74) *Attorney, Agent, or Firm* — Huawei Technologies Co., Ltd.

(57) ABSTRACT

This application discloses an information processing method. A communication device obtains an input sequence. The input sequence has a quantity B of information bits. The communication devices transforms the input sequence into one or more code blocks. The communication device encodes each of the code blocks individually, to obtain one or more encoded code blocks. Each of the code blocks has a code block length less than or equal to a maximum code block length. Each of the code blocks includes a segment of the input sequence and may include one or more cyclic redundancy check (CRC) bits corresponding to the segment of the input sequence. The encoded code blocks can meet various channel coding requirements.

22 Claims, 8 Drawing Sheets

(51) Int. Cl.
  *H03M 13/09* (2006.01)
  *H03M 13/11* (2006.01)
  *H04L 1/18* (2006.01)
(52) U.S. Cl.
  CPC ...... *H03M 13/6306* (2013.01); *H04L 1/0063* (2013.01); *H04L 1/18* (2013.01); *H04L 1/1874* (2013.01)

(56) References Cited

U.S. PATENT DOCUMENTS

| | | | |
|---|---|---|---|
| 6,944,348 B2* | 9/2005 | Kajita | H03M 13/09 382/239 |
| 7,227,851 B1* | 6/2007 | Gopalakrishnan | H04L 1/0025 370/335 |
| 8,255,761 B1* | 8/2012 | Pi | H04L 1/004 714/752 |
| 2001/0014113 A1* | 8/2001 | Imura | H04J 13/12 375/141 |
| 2003/0066018 A1* | 4/2003 | Yu | H03M 13/2975 714/792 |
| 2003/0076799 A1* | 4/2003 | Kwak | H04L 1/0061 370/335 |
| 2003/0123409 A1* | 7/2003 | Kwak | H04L 1/0061 370/335 |
| 2005/0108610 A1* | 5/2005 | Kim | H04L 1/0041 714/748 |
| 2008/0311920 A1* | 12/2008 | Xu | H04L 1/0003 455/450 |
| 2009/0077446 A1* | 3/2009 | Seo | H03M 13/09 714/755 |
| 2009/0077447 A1* | 3/2009 | Buckley | H03M 13/09 714/757 |
| 2009/0077456 A1* | 3/2009 | Pi | H03M 13/09 714/807 |
| 2009/0199066 A1* | 8/2009 | Kim | H04L 1/0065 714/752 |
| 2011/0261775 A1* | 10/2011 | Kim | H04L 1/0042 370/329 |
| 2014/0136922 A1* | 5/2014 | Oketani | H03M 13/2707 714/762 |
| 2014/0153484 A1* | 6/2014 | Kim | H04L 1/004 370/328 |
| 2014/0269981 A1 | 9/2014 | Asjadi | |
| 2015/0381209 A1* | 12/2015 | Roh | H03M 13/09 714/755 |
| 2016/0156432 A1* | 6/2016 | Seo | H04L 1/0061 714/807 |
| 2016/0164537 A1* | 6/2016 | Pisek | H03M 13/116 714/755 |

FOREIGN PATENT DOCUMENTS

| | | |
|---|---|---|
| CN | 105991227 A | 10/2016 |
| EP | 3484055 A1 | 5/2019 |

OTHER PUBLICATIONS

R1-1612282 Nokia et al.,"Code segmentation for eMBB data",3GPP TSG-RAN WG1 Meeting #87,Reno, USA, Nov. 14-18, 2016,total 4 pages.
XP051148975 R1-1608921 Spreadtrum Communications,"Code segmentation and CRC issues for LDPC codes",3GPP TSG RAN WG1 meeting #86bis,Lisbon, Portugal, Oct. 10-14, 2016,total 3 pages.
3GPP TS 36.212 V13.0.0 (Dec. 2015);3rd Generation Partnership Project;Technical Specification Group Radio Access Network;Evolved Universal Terrestrial Radio Access (E-UTRA);Multiplexing and channel coding(Release 13);total 121 pages.
Ericsson,"Introduction of LC/CE MTC",3GPP TSG-RAN WG1 Meeting #84 R1-161112,Change Request 36.211, Current version:13. 0.0,St Julian's, Malta, Feb. 15-19, 2016,total 124 pages.

* cited by examiner

INFORMATION PROCESSING METHOD, DEVICE, AND COMMUNICATIONS SYSTEM

CROSS-REFERENCE TO RELATED APPLICATIONS

This application is a continuation of International Application No. PCT/CN2018/071643, filed on Jan. 5, 2018, which claims priority to Chinese Patent Application No. 201710008135.6, filed on Jan. 5, 2017. The disclosures of the aforementioned patent applications are hereby incorporated by reference in their entireties.

TECHNICAL FIELD

Embodiments of the present application relate to the communications field, and in particular, to an information processing method, a device, and a communications system.

BACKGROUND

In a communications system, information, such as control information or data information, is usually transmitted between communications devices (for example, between a base station and a terminal) in the form of information sequences. Because the environment for wireless propagation is complex and varied, transmitted information sequences are susceptible to interference, and errors may occur. To reliably send the information sequences, a device at a transmitting end performs processing such as cyclic redundancy check (CRC), segmentation and check, channel coding, rate matching, and interleaving on the information sequence, and maps interleaved coded bits into modulation symbols and sends the modulation symbols to a device at a receiving end. After receiving the modulation symbols, the communications device at the receiving end correspondingly restores the modulation symbols to the information sequence through de-interleaving, de-rate matching, decoding, concatenation, and CRC. These processes can reduce transmission errors, and improve data transmission reliability.

New channel coding schemes, such as low-density parity-check (LDPC) code, polar code, etc., have been considered to be introduced into the fifth generation (5G) mobile communications system to improve performance. The LDPC code is a type of linear block code with a sparse check matrix, and is characterized by a flexible structure and low decoding complexity. Because decoding the LDPC code uses partially parallel iterative decoding algorithms, the LDPC code has a higher throughput than a conventional turbo code. An LDPC code frequently used in the communications system has a special structural feature, and a base matrix of the LDPC code has m*n elements. If using a lifting factor z for lifting (expansion), a parity check matrix H with (m*z)*(n*z) elements may be obtained. In other words, the parity check matrix H includes m*n block matrices. Each block matrix is either a z*z all-zero matrix or a block matrix obtained by circularly shifting an identity matrix. The lifting factor z is usually determined based on a code block size supported by the system and an information data size.

As different channel coding schemes are used, the communications system has different coding capabilities and decoding capabilities. How to process an information sequence to meet a channel coding requirement, so as to improve system coding performance and decoding performance becomes a problem to be resolved.

SUMMARY

In view of this, embodiments of the present application provide an information processing method, a device, and a communications system, so that a code block, that is output by performing processes on an input sequence, can meet channel coding requirements.

According to a first aspect, an information processing method in a communications system is provided, including:
obtaining an input sequence, wherein a length of the input sequence is B; and
obtaining C code blocks based on the input sequence and a maximum code block length Z in a code block length set, wherein each of the code blocks includes an input bit segment in the input sequence, at least one of the code blocks includes a cyclic redundancy check (CRC) bit segment whose length is L, or includes a filler bit segment, B, Z, and C are integers greater than 0, and L is an integer greater than or equal to 0 and less than Z.

Because the maximum code block length in the code block length set is considered for the code blocks obtained by performing process on the input sequence, a code block length requirement for channel coding input can be met, and a quantity of code blocks can also be reduced.

In a possible implementation of the foregoing aspect, if B>Z, and each of the code blocks includes a CRC bit segment whose length is L, then $C=\lceil B/(Z-L) \rceil$, where $\lceil x \rceil$ represents rounding to upper integer; and at least one of the C code blocks includes a segment whose length is $K_3$, where the segment includes an input bit segment and a CRC bit segment, and $K_3=\lceil (B+C \cdot L)/C \rceil$.

Optionally, the code block including the segment whose length is $K_3$ further includes a filler bit segment whose length is $F_3$, $F_3=I_3-K_3$, and $I_3$ is a minimum code block length greater than or equal to $K_3$ in the code block length set.

In another possible implementation based on the foregoing implementation, at least one of the C code blocks includes a segment whose length is $K_4$, $K_4=\lfloor (B+C \cdot L)/C \rfloor$, where $\lfloor x \rfloor$ represents rounding to lower integer, a quantity of code blocks including the segment whose length is $K_4$ is $C_4=C \cdot K_3-(B+C \cdot L)$, and a quantity of code blocks including the segment whose length is $K_3$ is $C_3=C-C_4$.

Optionally, the code block including the segment whose length is $K_4$ further includes a filler bit segment whose length is $F_4$, $F_4=I_4-K_4$, and $I_4$ is a minimum code block length in code block lengths greater than or equal to $K_4$ in the code block length set.

In the foregoing manner, in the code blocks obtained by performing process on the input sequence, code block lengths of any two code blocks are equal or are two adjacent code block lengths in the code block length set, and quantities of valid information bits in the any two code blocks differ by up to one bit, so that code rates of the code blocks are balanced. These code blocks are used as input for coding or decoding, so that system performance fluctuation can be avoided.

In another possible implementation of the foregoing aspect, if B≤Z, C=1. A length of a CRC bit segment in the code block is L=0; in other words, the code block includes no CRC bit segment. If a code block length $I_0$ is a minimum code block length in code block lengths greater than or equal to B in the code block length set, a length of a filler bit segment in the code block is $I_0-B$.

In another possible implementation of the foregoing aspect, if a self-check capability is provided in a channel coding scheme, no CRC bit segment may be added; in other words, L=0. In this case, $C=\lceil B/Z \rceil$, the C code blocks include at least one code block in which an input bit segment has a length of $K_5$, and $K_5=\lceil B/C \rceil$.

Optionally, the code block in which the input bit segment has the length of $K_5$ further includes a filler bit segment whose length is $F_5$, $F_5=I_5-K_5$, and $I_5$ is a minimum code block length in code block lengths greater than or equal to $K_5$ in the code block length set.

In another possible implementation based on the foregoing implementation, the C code blocks further include at least one code block in which an input bit segment has a length of $K_6$, $K_6=\lceil B/C \rceil$, and in the C code blocks, a quantity of code blocks in which the input bit segment has the length of $K_6$ is $C_6=C \cdot K_5-B$, and a quantity of code blocks in which the input bit segment has the length of $K_5$ is $C_5=C-C_6$.

In the foregoing implementation, the code blocks obtained by performing process on the input sequence do not include the CRC bit segment, so that system CRC overheads can be reduced.

In another possible implementation based on the foregoing aspect, if L>0, each of the code blocks includes a CRC bit segment. The CRC bit segment is a parity bit segment generated for an input bit segment in each of the code blocks, or the CRC bit segment is a parity bit segment generated for an input bit segment and a filler bit segment in each of the code blocks.

According to a second aspect, an information processing method in a communications system is provided, including:

obtaining an input sequence, wherein a length of the input sequence is B;

determining a quantity G of code block groups and a quantity of code blocks in each code block group based on one of a maximum quantity $G_{max}$ of code block groups and a maximum quantity M of code blocks in each code block group, the input sequence, and a maximum code block length Z in a code block length set; and obtaining C code blocks based on the input sequence, the quantity G of code block groups, and the quantity of code blocks in each code block group.

In a possible implementation of the first aspect or the second aspect, the C code blocks include G code blocks including a CRC bit segment, where G is an integer greater than 0 and less than or equal to C.

In another possible implementation of the first aspect or the second aspect, the C code blocks belong to G code block groups, each of the code block groups has one code block including a CRC bit segment, and each CRC bit segment is a parity bit segment generated for an input bit segment in at least one code block in one code block group, or each CRC bit segment is a parity bit segment generated for an input bit segment and a filler bit segment in at least one code block in one code block group.

System CRC overheads can be reduced because CRC bit segments are added, by code block group, to a plurality of code blocks obtained by performing process on the input sequence. In addition, when an ACK feedback is performed by code block group, performance is better, and system efficiency is improved.

In another possible implementation based on the foregoing implementation, $G=\lceil B/(M \cdot Z-L) \rceil$ or $G=\min(\lceil B/(Z-L) \rceil, G_{max})$, where M is an integer greater than 0, $\lceil C/G \rceil \leq M$, $G_{max}>0$, $G_{max}$ is a maximum supported quantity of code block groups, and $C=\lceil (B+G \cdot L)/Z \rceil$.

In another possible implementation based on the foregoing implementation, the G code block groups include at least one code block group including $C_9$ code blocks, and $C_9=\lceil C/G \rceil$.

Optionally, the G code block groups include at least one code block group including $C_{10}$ code blocks, $C_{10}=\lfloor C/G \rfloor$, a quantity of code block groups including $C_{10}$ code blocks is $G_2=G-C_9-C$, and a quantity of code block groups including $C_9$ code blocks is $G_1=G-G_2$.

In the foregoing implementation, any two code block groups differ by up to one code block, so that the code block groups tend to have consistent block error rates (BLER) and consistent missed detection performance.

According to a third aspect, an information processing method in a communications system is provided, including:

obtaining C code blocks based on a length of an output sequence and a maximum code block length Z in a code block length set; and obtaining the output sequence based on the C code blocks, wherein each of the code blocks includes an output bit segment in the output sequence, at least one of the code blocks includes a cyclic redundancy check CRC bit segment whose length is L, or includes a filler bit segment, B, Z, and C are integers greater than 0, and L is an integer greater than or equal to 0 and less than Z.

According to a fourth aspect, a communications device is provided, including:

an obtaining unit, configured to obtain an input sequence; and a processing unit, configured to obtain C code blocks based on the input sequence and a maximum code block length Z in a code block length set, where each of the code blocks includes an input bit segment in the input sequence, at least one of the code blocks includes a cyclic redundancy check CRC bit segment whose length is L, or includes a filler bit segment, B, Z, and C are integers greater than 0, and L is an integer greater than or equal to 0 and less than Z.

The communications device may be configured to perform a method performed by a device at a transmitting end described in the foregoing aspects. For details, refer to the description in the foregoing aspects.

In a possible design, the communications device provided in this application may include a corresponding module or unit configured to perform a process of the device at the transmitting end in the foregoing method design. The module or unit may be software, hardware, or software and hardware.

According to a fifth aspect, a communications device is provided, including:

an obtaining unit, configured to obtain C code blocks based on a length of an output sequence and a maximum code block length Z in a code block length set; and a processing unit, configured to obtain the output sequence based on the C code blocks obtained by the obtaining unit, wherein each of the code blocks includes an output bit segment in the output sequence, at least one of the code blocks includes a cyclic redundancy check CRC bit segment whose length is L, or includes a filler bit segment, B, Z, and C are integers greater than 0, and L is an integer greater than or equal to 0 and less than Z.

The communications device may be configured to perform a method performed by a device at a receiving end described in the foregoing aspects. For details, refer to the description in the foregoing aspects.

In a possible design, the communications device provided in this application may include a corresponding module or unit configured to perform a behavior of the device at the receiving end in the foregoing method design. The module or unit may be software, hardware, or software and hardware.

According to a sixth aspect, an embodiment of the present application provides a communications system, and the system includes the communications device described in the foregoing aspects.

In addition, an embodiment of the present application provides a computer storage medium, and the computer storage medium includes a program designed to perform the foregoing aspects.

According to the method, the device, and the communications system in the embodiments of the present application, code blocks that are obtained by performing process on the input sequence can meet code block length set requirements in different channel coding schemes, so that differences between code rates of the code blocks are balanced. These code blocks are used for coding or decoding, so that processing performance of the communications system can be improved.

DESCRIPTION OF EMBODIMENTS

The following clearly describes the technical solutions in the embodiments of the present application with reference to the accompanying drawings.

Figure 1:
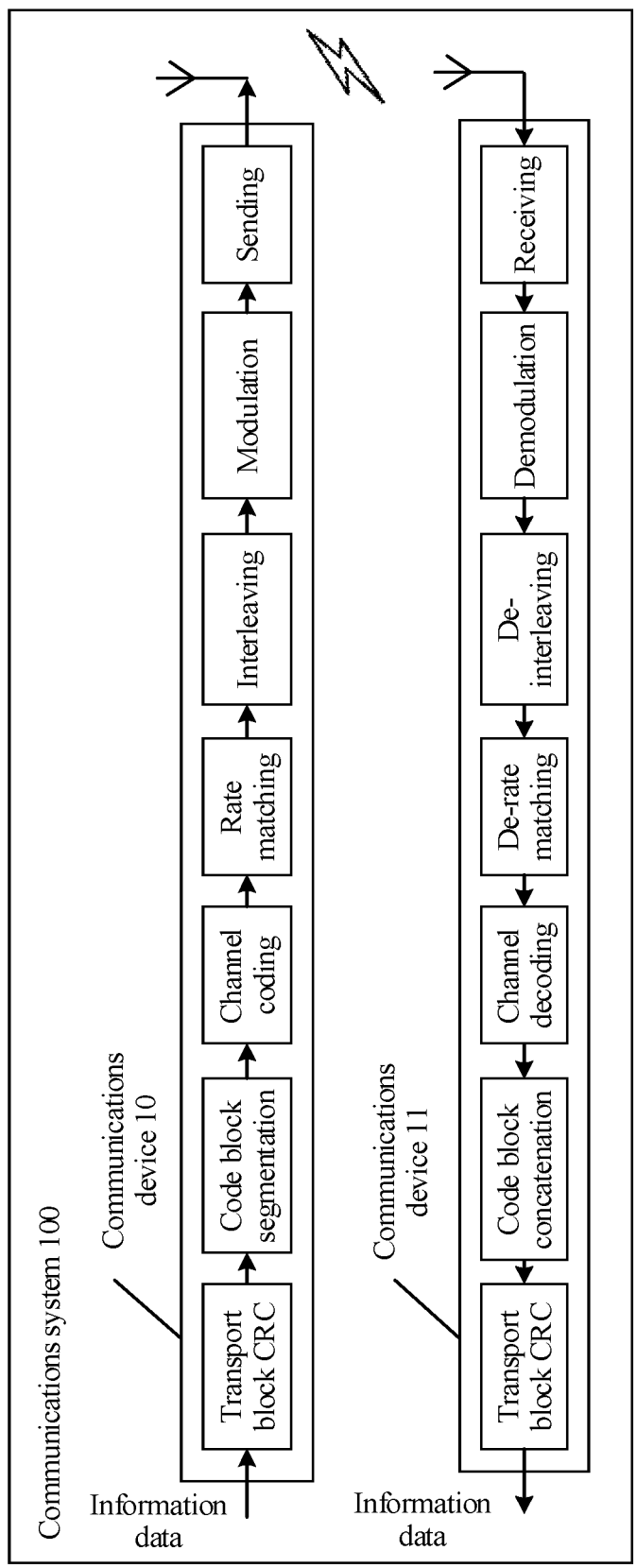
FIG. 1 is a schematic diagram of a communications system in which embodiments of the present application may be implemented.

As shown in FIG. 1, a communications system 100 includes a communications device 10 and a communications device 11. Information, such as control information or data information, is received and sent between the communications device 10 and the communications device 11 in the form of information sequences. The communications device 10 serves as a device at a transmitting end, and sends the information in transport blocks, and transport block CRC bits are attached to each transport block. A transport block to which transport block CRC bits are attached is referred to as an input sequence. If a length of the input sequence is less than a maximum code block length Z, the input sequence is inserted with filler bits based on a code block length in a code block length set, and is input into an encoder, to perform channel coding. If a length of the input sequence exceeds a maximum code block length Z, the input sequence is divided into a plurality of input bit segments. Each code block that is input into the encoder includes one of the input bit segments. Further, CRC bit segments may be attached to some or all code blocks to improve error detection performance of the code blocks. Further, filler bits may be inserted to some or all code blocks so that a block length of each code block equals an allowable code block length defined in a block length set. The communications device 10 performs channel coding such as LDPC code-based coding on each code block to obtain a corresponding coded block. Each coded block includes a plurality of information bits and a plurality of parity bits generated through coding. The information bits and the parity bits are collectively referred to as coded bits.

The coded block is stored in a circular buffer of the communications device 10 after sub-block interleaving, and the communications device 10 selects a segment of coded bits from the circular buffer, also referred as a coded bit segment. The coded bit segment is interleaved and mapped into modulation symbols for sending. During retransmission, the communications device 10 selects another coded bit segment from the circular buffer for sending. If all data in the circular buffer has been transmitted, coded bits are selected again from a front end of the circular buffer.

The communications device 11, which is used as a device at a receiving end, demodulates the received modulation symbols, and stores soft values of the received coded bit segment in a corresponding position in a soft buffer after de-interleaving. If retransmission occurs, the communications device 11 combines soft values of retransmitted coded bit segments and stores the combined soft values in the soft buffer. The combination herein means that if coded bits received in different times are in a same position, soft values of the coded bits received in the different times are combined. The communications device 11 decodes all soft values in the soft buffer to obtain a code block in the information sequence. Because the communications device 11 may obtain a transport block size, the communications device 11 determines a quantity of code blocks into which a transport block is segmented and a length of each code block. The communications device 11 may obtain an output bit segment in each code block. If the code block includes a CRC bit segment, the communications device 11 may further check the output bit segment in the code block or the output bit segment and a filler bit segment in the code block by using the CRC bit segment. The communications device 11 concatenates output bit segments into an output sequence, namely, a transport block, and further checks and concatenates transport blocks to finally obtain an information sequence. It can be learned that the communications device 11 performs an inverse process of an information processing method of the communications device 10.

In the embodiments of the present application, the communications device 10 may be a network device in a communications system, such as a base station, and correspondingly, the communications device 11 may be a terminal. Alternatively, the communications device 10 may be a terminal in a communications system, and correspondingly, the communications device 11 may be a network device in the communications system, such as a base station.

For ease of understanding, some terms involved in this application are described below.

In this application, terms "network" and "system" are often interchangeably used, and meanings of which are conventionally understood.

A terminal is a device having a communication function, and may include a handheld device, an in-vehicle device, a wearable device, a computing device, an information processing device connected to a wireless modem, or the like that has a wireless communication function. The terminal may have different names in different networks, for example, user equipment, mobile station, subscriber unit, station, cellular phone, personal digital assistant, wireless modem, wireless communications device, handheld device, laptop computer, cordless phone, and wireless local loop station. For ease of description, these devices are simply referred to as the terminal in this application. A base station (BS) may also be referred to as a base station device, and is a device deployed in a radio access network to provide a wireless communication function.

The base station may have different names in different wireless access systems. For example, a base station in a Universal Mobile Telecommunications System (UMTS) network is referred to as a NodeB, a base station in an LTE network is referred to as an evolved NodeB (eNB or eNodeB), or a base station in a 5th generation network may have another name. This is not limited in the present application.

Figure 2:
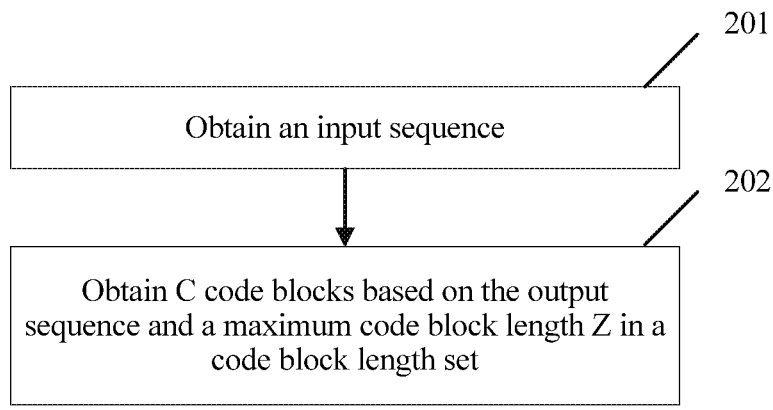
FIG. 2 is a flowchart of an information processing method according to an embodiment of the present application.

FIG. 2 is a flowchart of an information processing method in a communications system according to an embodiment of the present application. The method may be applied to a device at a transmitting end, and includes the following steps.

201. Obtain an input sequence.

In the embodiments of the present application, the input sequence may be a transport block or a transport block to which transport block CRC bits are attached. The transport block herein is used to transmit control information or data information. The transport block or the transport block to which the transport block CRC bits are attached, which is obtained by the device at the transmitting end, may be used as an input sequence for code block segmentation.

A length of the input sequence is B; in other words, the input sequence includes B bits. The B bits may be usually represented as $b_0, b_1, \ldots, b_{B-1}$, and B is an integer greater than 0.

202. Obtain C code blocks based on the input sequence obtained in step 201 and a maximum code block length Z in a code block length set. Each of the code blocks includes an input bit segment in the input sequence, and at least one of the code blocks includes a code block cyclic redundancy check CRC bit segment whose length is L, or includes a filler bit segment.

Both Z and C are integers greater than 0, and L is an integer greater than or equal to 0 and less than Z.

The code block length set is usually defined in the system, and includes one or more allowable code block lengths. The maximum code block length is Z. Code block length sets may be different in different channel coding schemes. For example, LDPC coding is used in channel coding, a size of an LDPC base matrix is 34*50, in which 16 columns correspond to information bits. A value of a lifting factor z is taken from {8, 10, 12, 14, 16, 20, 24, 28, 32, 40, 48, 56, 64, 80, 96, 112, 128, 160, 192, 224, 256, 320, 384}. Then a code block length in the code block length set is 16*z. In other words, as a product of the lifting factor z and a quantity of columns corresponding to the information bits, the maximum code block length Z is 16*384=6144 bits. It should be noted that the example does not constitute a limitation.

Each code block obtained by performing code block segmentation on the input sequence by the device at the transmitting end is an output sequence of the code block segmentation, and each code block may be represented as $C_{r0}, C_{r1}, C_{r2}, C_{r3}, \ldots, C_{r(K_r-1)}$, where r is a code block number, $0 \le r < C$, and $K_r$ is a code block length of a code block r, namely, a quantity of bits in the code block r.

In a possible implementation, the input sequence is divided into C input bit segments based on the maximum code block length Z. In this case, in the C code blocks, a code block i includes an input bit segment i, a code block j includes an input bit segment j, and so on, where $0 \le i, j < C$.

In addition to an input bit segment, a code block may optionally include at least one of a CRC bit segment and a filler bit segment, where a length of the CRC bit segment is L.

A new channel coding scheme, such as the LDPC coding scheme, provides a better self-check capability and a more flexible manner of CRC bit segment attachment. For example, a CRC bit segment whose length is L may be attached to each input bit segment; one CRC bit segment whose length is L may be attached to a plurality of input bit segments as a whole; or the input bit segment is not attached with a CRC bit segment, thus in this case, L=0. Correspondingly, in C code blocks, each of the code blocks includes a CRC bit segment, or each code block in G code blocks includes a CRC bit segment, where G is greater than 0 and less than or equal to C, or none of the code blocks includes a CRC bit segment.

For ease of description, in the embodiments of the present application, a bit segment including an input bit segment and a CRC bit segment in a code block is sometimes referred to as a segment. If a difference between a block length K in the code block length set and a length of a segment in a code block is not 0, and K is a minimum code block length greater than or equal to the length of the segment, the code block further includes a filler bit segment. A length of the filler bit segment is a difference between the allowable block length K and the length of the segment. The filler bit segment includes one or more bits whose values are <NULL>, and the bit whose value is <NULL> may also be set to "0" in some systems.

Figure 3:
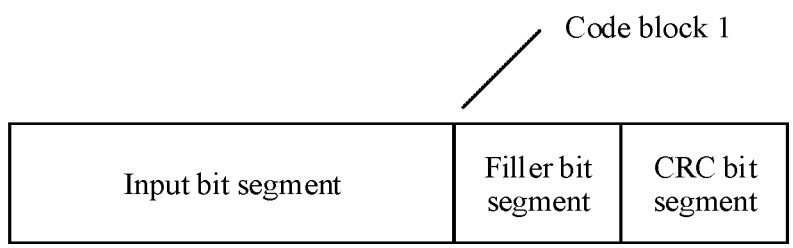
FIG. 3 is a schematic structural diagram of a code block according to an embodiment of the present application.
Figure 4:
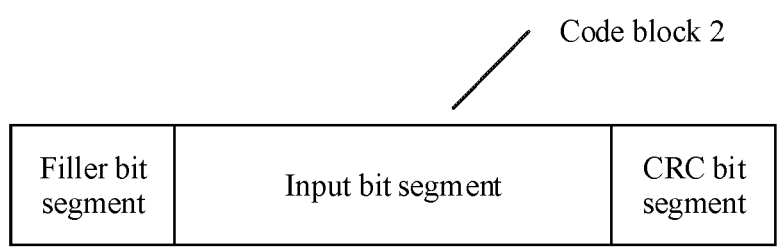
FIG. 4 is a schematic structural diagram of a code block according to another embodiment of the present application.

If the code block includes the filler bit segment, the CRC bit segment may be a parity bit segment generated for the segment, or may be a parity bit segment generated for the input bit segment. For example, the input bit segment in the code block may be first checked to generate the CRC bit segment, and then the filler bit segment is inserted. For another example, the filler bit segment may be first inserted into the code block, then the input bit segment and the filler bit segment in the code block are checked to generate the CRC bit segment, and the CRC bit segment is attached to the code block. Positions of the input bit segment, the filler bit segment, and the CRC bit segment in the code block are not limited herein. The CRC bit segment may be placed in the last segment of the code block, such as a code block 1 shown in FIG. 3, or the filler bit segment may be placed in front of the input bit segment in the code block, such as a code block 2 shown in FIG. 4. It should be noted that only examples are described herein, and the examples do not constitute a limitation in the present application.

Because the maximum code block length in the code block length set is considered for the code blocks obtained after the input sequence is processed, a code block length requirement for channel coding input can be met, and a quantity of code blocks can also be reduced.

Due to the C code blocks generated based on the input sequence, each code block length needs to be a code block length in the code block length set. Code block lengths in the code block length set are arranged in ascending order or descending order of the lengths. Lengths of any two of the C generated code blocks are either equal or two adjacent code block lengths in the code block length set, so that code rates of the code blocks are balanced. Code block segmentation may be implemented in a plurality of manners.

Figure 5:
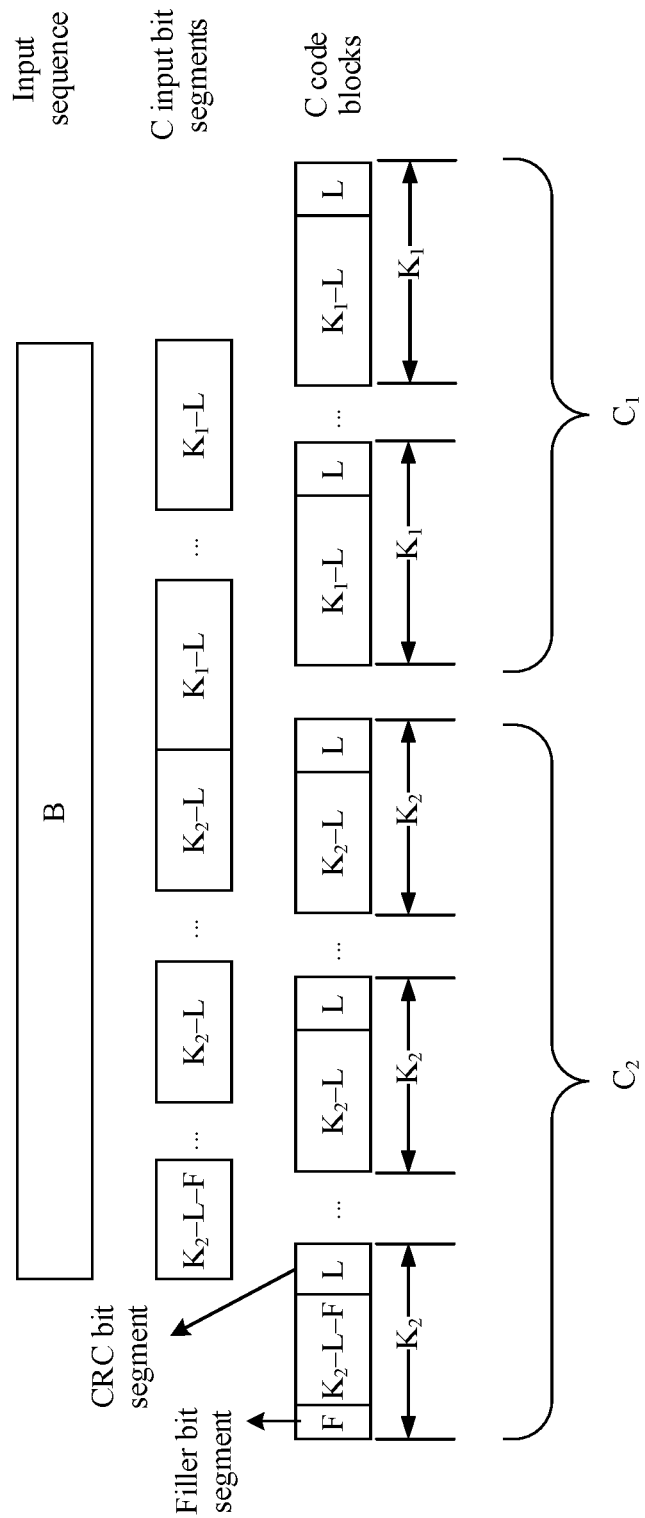
FIG. 5 is a schematic diagram of a code block segmentation manner according to an embodiment of the present application.

FIG. 5 is a schematic diagram of a code block segmentation manner according to an embodiment of the present application. In this manner, only one code block includes a filler bit segment. This is applicable to a case in which two adjacent code block lengths in the code block length set have a relatively small difference. As shown in FIG. 5, the segmentation manner includes the following content.

If $B>Z$, and each of the code blocks includes the CRC bit segment whose length is L, then C meets $C=\lceil B/(Z-L) \rceil$, where $\lceil x \rceil$ represents rounding the number x to upper integer. It may be understood that if $B/(Z-L)$ is an integer, a value of $B/(Z-L)$ is equal to a value of $\lceil B/(Z-L) \rceil$, and is also equal to a value of $\lfloor B/(Z-L) \rfloor$, wherein $\lfloor x \rfloor$ represents rounding the number x to lower integer, and it may be considered that C meets $C=\lceil B/(Z-L) \rceil$. In the C code blocks, there are $C_1$ code blocks whose code block lengths are $K_1$ and $C_2$ code blocks whose code block lengths are $K_2$. $K_1$ is a minimum code block length in code block lengths that meet $C \cdot K_1 \geq (B+C \cdot L)$ in the code block length set, and $K_2$ is a maximum code block length in code block lengths less than $K_1$ in the code block length set, $$C_2 = \left\lfloor \frac{C \cdot K_1 - (B + C \cdot L)}{K_1 - K_2} \right\rfloor,$$

$C_1 = C - C_2$. One of the code blocks whose code block lengths are $K_2$ includes a filler bit segment, and a length of the filler bit segment is $F = C_1 \cdot K_1 + C_2 \cdot K_2 - (B + C \cdot L)$. It may be understood that for rounding up $\lceil \cdot \rceil$ or rounding down $\lfloor \cdot \rfloor$ in this application, if a to-be-rounded parameter is an integer, the parameter may be not rounded up or rounded down, or the integer parameter may be rounded up, or the integer parameter may be rounded down, and the results are the same.

It can be learned from FIG. 5 that the input sequence whose length is B is divided into C input bit segments based on a determined quantity of code blocks and determined code block lengths. One of the input bit segments has a length of $K_2-L-F$, $C_2-1$ input bit segments have a length of $K_2-L$, and $C_1$ input bit segments have a length of $K_1-L$. There are $C_2$ code blocks whose length is $K_2$ and there are $C_1$ code blocks whose length is $K_1$. A length of an input bit segment in a code block whose code block length is $K_2$ and that includes the filler bit segment is $K_2-L-F$. A length of an input bit segment in a code block whose code block length is $K_2$ and that includes no filler bit segment is $K_2-L$. A length of an input bit segment in the code block whose code block length is $K_1$ is $K_1-L$. It should be noted that the position of the filler bit segment shown in the figure is merely an example, and is not limited to the first code block, or is not limited to the beginning of the code block. The filler bit segment may be after the CRC bit segment in the code block.

Taking B=32000 bits, Z=6144 bits, L=24 bits, and the LDPC code block length set used in the foregoing embodiment as an example, a quantity of code blocks is $C=\lceil B/(Z-L) \rceil=6$. A total length after the CRC bit segment is attached to each code block is $B+C \cdot L=32144$ bits. The minimum code block length $K_1$ in code block lengths that meet $C \cdot K_1 \geq (B+C \cdot L)$ in the code block length set is 6144 bits, and the maximum code block length $K_2$ in code block lengths less than $K_1$ in the code block length set is 5120 bits. In this case, six code blocks include two code blocks whose code block length is $K_1$=6144 bits, and four code blocks whose code block length is $K_2$=5120 bits. One of the four code blocks whose code block length is $K_2$ further includes a filler bit segment whose length is 624 bits. For example, a first code block whose code block length is $K_2$ may include the filler bit segment whose length is 624 bits. It should be noted that only examples are described herein, and the examples do not constitute a limitation.

Optionally, in this manner, if the length of the input sequence meets $B \leq Z$, C=1. A length of a CRC bit segment in the code block is L=0, i.e., no CRC bit segment. If a code block length $I_0$ in the code block length set is a minimum code block length in code block lengths greater than or equal to B, a length of a filler bit segment in the code block is $I_0-B$.

Figure 6:
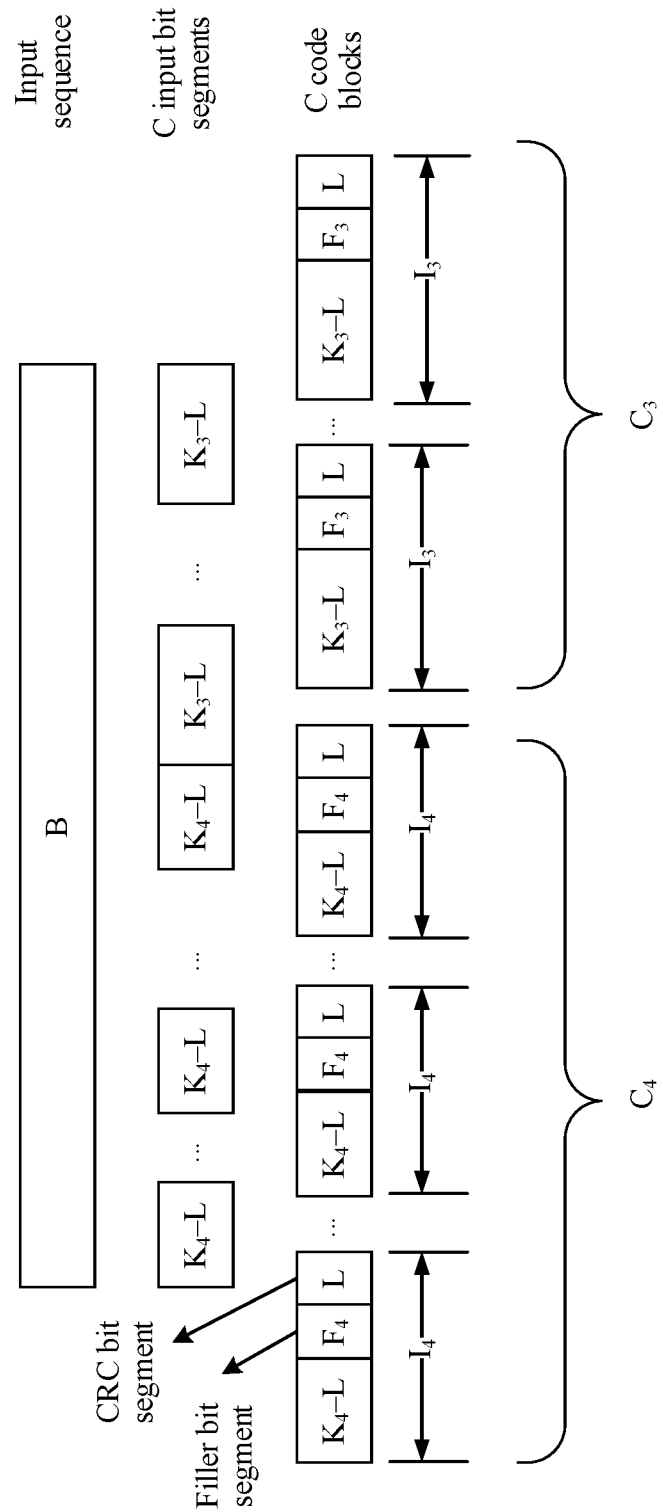
FIG. 6 is a schematic diagram of a code block segmentation manner according to another embodiment of the present application.

FIG. 6 is a schematic diagram of a code block segmentation manner according to another embodiment of the present application.

As shown in FIG. 6, if $B>Z$, and each of the code blocks includes the CRC bit segment whose length is L, then $C=\lceil B/(Z-L) \rceil$, where $\lceil x \rceil$ represents rounding the number x to upper integer. A total length of the input sequence and CRC bit segments is $(B+C \cdot L)$. As described in the foregoing embodiment, a segment includes an input bit segment and a CRC bit segment. In this case, after balanced segmentation is performed, at least one of the C code blocks includes a segment which has a length of $K_3$, and $K_3=\lceil (B+C \cdot L)/C \rceil$. It can be learned that $K_3$ is an integer. It may be understood that when $(B+C \cdot L)$ is divisible by C, $(B+C \cdot L)/C$ is an integer, and $K_3=\lceil (B+C \cdot L)/C \rceil=(B+C \cdot L)/C=\lfloor (B+C \cdot L)/C \rfloor$. In other words, when $(B+C \cdot L)$ is divisible by C, the value of $K_3$ is equal to a value of $(B+C \cdot L)/C$. A rounding operation may be not performed on $(B+C \cdot L)/C$, or $(B+C \cdot L)/C$ may be rounded up or rounded down, and this does not affect a result of the value of $K_3$.

The code block in which the segment has the length of $K_3$ further includes a filler bit segment whose length is $F_3$, $F_3=I_3-K_3$, and $I_3$ is a minimum code block length in code block lengths greater than or equal to $K_3$ in the code block length set. If $F_3$ is 0, the code block in which the segment has the length of $K_3$ includes no filler bit segment.

Further, at least one of the C code blocks includes a segment whose length is $K_4$, and $K_4$ meets $K_4=\lfloor (B+C \cdot L)/C \rfloor$. In the C code blocks, a quantity of code blocks including the segment whose length is $K_4$ is $C_4=C \cdot K_3-(B+C \cdot L)$, and a quantity of code blocks including the segment whose length is $K_3$ is $C_3=C-C_4$. It may be understood that when $(B+C \cdot L)$ is divisible by C, $(B+C \cdot L)/C$ is an integer, and $K_4=\lceil (B+C \cdot L)/C \rceil=(B+C \cdot L)/C=\lfloor (B+C \cdot L)/C \rfloor$. In other words, when $(B+C \cdot L)$ is divisible by C, the value of $K_4$ is equal to a value of $(B+C \cdot L)/C$. A rounding operation may be not performed on $(B+C \cdot L)/C$, or $(B+C \cdot L)/C$ may be rounded up or rounded down, and this does not affect a result of $K_4$.

If $(B+C \cdot L) \% C=0$, and % represents a modulo operation, in other words, when $(B+C \cdot L)$ is divisible by C, $K_4=K_3$, and $\lceil (B+C \cdot L)/C \rceil$ is equal to $\lfloor (B+C \cdot L)/C \rfloor$. In other words, $K_3$ or $K_4$ is equal to $(B+C \cdot L)/C$. Each of the C code blocks includes the segment whose length is $K_3$ or $K_4$; in other words, there are C code blocks in which the segment has the length of $K_3$ or $K_4$.

The code block in which the segment has the length of $K_4$ further includes a filler bit segment whose length is $F_4$, $F_4=I_4-K_4$, and $I_4$ is a minimum code block length in code block lengths greater than or equal to $K_4$ in the code block length set. If $F_4$ is 0, the code block in which the segment has the length of $K_4$ includes no filler bit segment.

It can be learned from FIG. 6 that the input sequence whose length is B is divided into C input bit segments based on a determined quantity of code blocks and determined code block lengths. $C_4$ input bit segments have a length of $K_4$-L, and $C_3$ input bit segments have a length of $K_3$-L. There are $C_4$ code blocks in which the segment has the length of $K_4$ and whose code block length is $I_4$, and there are $C_3$ code blocks in which the segment has the length of $K_3$ and whose code block length is $I_3$. A length of an input bit segment in the code block in which the segment has the length of $K_4$ is $K_4$-L, and a length of an input bit segment in the code block in which the segment has the length of $K_3$ is $K_3$-L. The filler bit segments are well distributed in all the code blocks. It should be noted that a location of the filler bit segment shown in the figure is merely an example, and is not limited to a middle position of the code block. The filler bit segment may be placed before the input bit segment in the code block, or may be placed after the CRC bit segment in the code block.

Still using the above example of B=32000 bits, L=24 bits, and the same foregoing LDPC code block length set for illustration. A quantity of columns corresponding to information bits (information-bit-column) in an LDPC base matrix is 16, a maximum code block length in the code block length set is Z=16*384=6144 bits, and a quantity of blocks is C=⌈B/(Z-L)⌉=6. A total length after the CRC bit segment is attached to each code block is B+C·L=32144 bits. After balanced segmentation is performed, $K_3$ is 5358 bits, and $K_4$ is 5357 bits. After the segmentation, two code blocks in which a segment has a length of 5358 bits and four code blocks in which a segment has a length of 5357 bits are obtained. A minimum code block length $I_3$ in code block lengths greater than or equal to $K_3$ is 6144 bits, and an lifting factor z of an LDPC matrix used for channel encoding the code blocks in which the segment has the length of $K_3$ is a minimum value 384 in lifting factors greater than or equal to ⌈$K_3$/16⌉. A minimum code block length $I_4$ in code block lengths greater than or equal to $K_4$ is 6144 bits, and a lifting factor z of an LDPC matrix used for channel encoding the code blocks in which the segment has the length of $K_4$ is a minimum value 384 in lifting factors greater than or equal to ⌈$K_4$/16⌉. Correspondingly, a length of a filler bit segment in the code blocks in which the segment has the length of 5358 bits is 786 bits, and a length of a filler bit segment in the code blocks in which the segment has the length of 5357 bits is 787 bits.

B=25604 bits, L=24 bits, and the foregoing LDPC code block length set are used as another example. Z=16*384=6144 bits, a quantity of blocks is C=⌈B/(Z-L)⌉=5, and a length of each code block to which the CRC bit segment is attached is B+C·L=25604 bits. After balanced segmentation is performed, $K_3$ is 5121 bits, and $K_4$ is 5120 bits. After the segmentation, four code blocks in which a segment has a length of 5121 bits and four code blocks in which a segment has a length of 5120 bits are obtained. A minimum code block length $I_3$ in code block lengths greater than or equal to $K_3$ is 6144 bits, and a lifting factor z in an LDPC matrix used for channel encoding the code blocks in which the segment has the length of $K_3$ is a minimum value 384 in lifting factors greater than or equal to ⌈$K_3$/16⌉. A minimum code block length $I_4$ in code block lengths greater than or equal to $K_4$ is 5120 bits, and a lifting factor z in an LDPC matrix used for channel encoding the code blocks in which the segment has the length of $K_4$ is a minimum lifting factor 320 in lifting factors greater than or equal to ⌈$K_4$/16⌉. Correspondingly, a length of a filler bit segment in the code blocks in which the segment has the length of 5358 bits is 1023 bits, and a length of a filler bit segment in the code blocks in which the segment has the length of 5357 bits is 0 bits.

It should be noted that only examples are described above, and the examples do not constitute a limitation.

Optionally, in this manner, if the length of the input sequence meets B≤Z, then C=1. A length of a CRC bit segment in the code block is L=0; in other words, the code block includes no CRC bit segment. If a code block length $I_0$ in the code block length set is a minimum code block length in code block lengths greater than or equal to B, a length of a filler bit segment in the code block is $I_0$-B.

Input bits and CRC bits included in a code block are also usually referred to as valid information bits, and a quantity of valid information bits is a numerator for calculating a code rate of the code block. When adjacent code block lengths in the code block length set have a relatively large difference, if one code block includes a large quantity of filler bits, and the other code block includes no filler bit, there is a relatively large difference between quantities of valid information bits in the two different code blocks. Further, lengths of sequences output after coding and rate matching are performed on code blocks are usually the same or balanced; in other words, denominators for calculating code rates of the code blocks are basically the same. Consequently, there is a relatively large difference between the code rates of the code blocks, thus overall performance deteriorates during system coding or decoding. In the foregoing manners, in the code blocks obtained after the input sequence is processed, code block lengths of any two code blocks are either equal or two adjacent code block lengths in the code block length set, quantities of valid information bits in the any two code blocks differ by up to one bit, and filler bit segments are well distributed in the code blocks, so that the code rates of the code blocks are balanced. These code blocks are used as input for coding or decoding, so that system performance fluctuation can be avoided.

Figure 7:
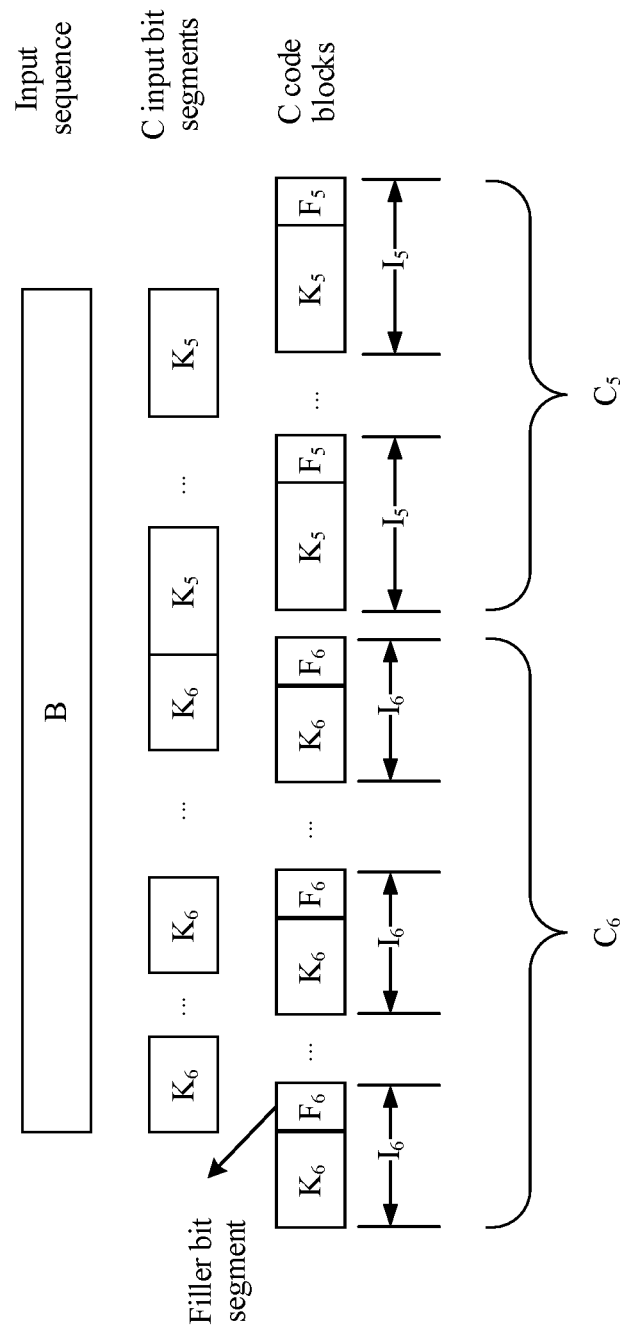
FIG. 7 is a schematic diagram of a code block segmentation manner according to yet another embodiment of the present application.

FIG. 7 is a schematic diagram of a code block segmentation manner according to yet another embodiment of the present application. In this manner, no CRC bit segment is added to each code block; in other words, L=0.

As shown in FIG. 7, a quantity of code blocks is C=⌈B/Z⌉, the C code blocks include at least one code block in which an input bit segment has a length of $K_5$, and K=⌈B/C⌉.

The code block in which the input bit segment has the length of $K_5$ further includes a filler bit segment whose length is $F_5$, $F_5=I_5-K_5$, and $I_5$ is a minimum code block length in code block lengths greater than or equal to $K_5$ in the code block length set.

The C code blocks further include at least one code block in which an input bit segment has a length of $K_6$, $K_6=⌊B/C⌋$, and the C code blocks include $C_6$ code blocks in which the input bit segment has the length of $K_6$, where C=C·$K_5$−B, and $C_5$ code blocks in which the input bit segment has the length of $K_5$, where $C_5$C−$C_6$.

If B % C=0, and % represents a modulo operation, $K_6=K_5$, and each of the C code blocks includes the input bit segment whose length is $K_5$; in other words, there are C code blocks in which the input bit segment has the length of $K_5$.

The code block in which the input bit segment has the length of $K_6$ further includes a filler bit segment whose length is $F_6$, $F_6=I_6-K_6$, and $I_6$ is a minimum code block length in code block lengths greater than or equal to $K_6$ in the code block length set.

It can be learned from FIG. 7 that the input sequence whose length is B is divided into C input bit segments based on a determined quantity of code blocks and determined code block lengths. $C_6$ input bit segments have a length of $K_6$, and $C_5$ input bit segments have a length of $K_5$. There are $C_6$ code blocks in which the input bit segment has the length of $K_6$ and whose code block lengths are $I_6$, and there are $C_5$ code blocks in which the input bit segment has the length of $K_5$ and whose code block lengths are $I_5$. The filler bit segments are well distributed in all the code blocks. It should be noted that a location of the filler bit segment shown in the figure is merely an example, and is not limited to the end of the code block. The filler bit segment may be before the input bit segment in the code block, or may be after the input bit segment in the code block.

B=32000 bits and the foregoing LDPC code block length set are still used in another example. Z=16*384=6144 bits, and a quantity of blocks is C=⌈B/Z⌉=6. After balanced segmentation is performed, $K_5$ is 5334 bits, $K_6$ is 5333 bits, there are four code blocks in which an input bit segment has a length of $K_5$, there are two code blocks in which an input bit segment has a length of $K_6$, and $I_5=I_6=6144$ bits. Correspondingly, a length of a filler bit segment in the code block in which the input bit segment has the length of $K_5$ is 810 bits, and a length of a filler bit segment in the code block in which the input bit segment has the length of $K_6$ is 811 bits. It should be noted that only examples are described herein, and the examples do not constitute a limitation.

If a better self-check capability is provided in channel coding, the code blocks, obtained after the input sequence is processed, do not include the CRC bit segment, so that system CRC overheads can be reduced.

Figure 8:
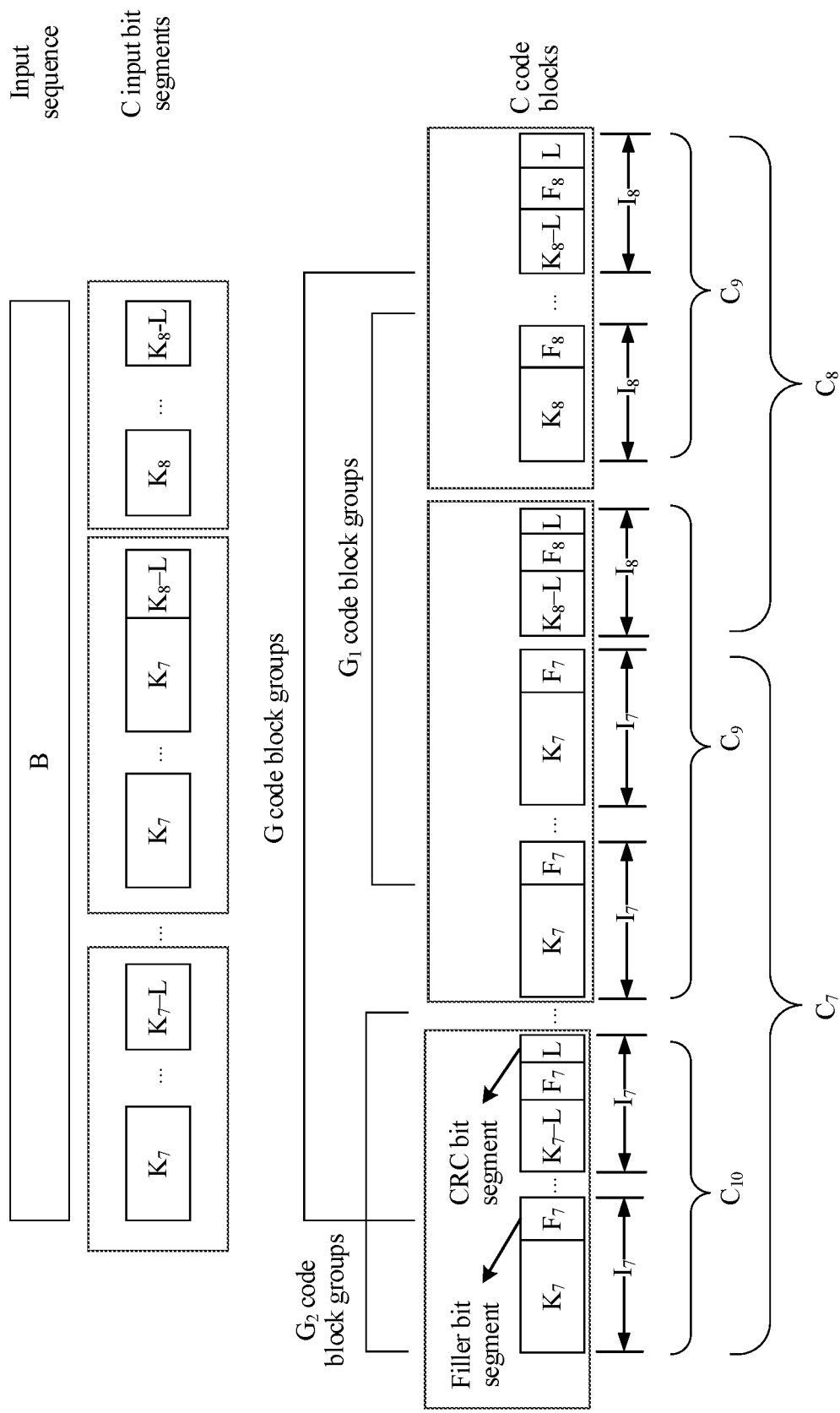
FIG. 8 is a schematic diagram of a code block segmentation manner according to still another embodiment of the present application.

FIG. 8 is a schematic diagram of a code block segmentation manner according to still another embodiment of the present application. The manner may be applied to a scenario in which one CRC bit segment is added to a plurality of input bit segments. In this case, the C code blocks include G code blocks having the CRC bit segment, where G is an integer greater than 0 and less than or equal to C.

As shown in FIG. 8, the C code blocks belong to G code block groups, and a quantity of code block including the CRC bit segment in each code block group is one. The CRC bit segment in any code block group may be a parity bit segment generated for an input bit segment in at least one code block in the code block group. Or, the CRC bit segment may be a parity bit segment generated for an input bit segment and a filler bit segment in at least one code block in the code block group. For example, the CRC bit segment may be a parity bit segment generated only for an input bit segment in the code block to include the CRC bit segment, or may be a parity bit segment generated for input bit segments in all code blocks in a code block group, may be a parity bit segment generated only for an input bit segment and a filler bit segment in the code block including the CRC bit segment, or may be a parity bit segment generated for input bit segments and filler bit segments in all code blocks in a code block group. It should be noted that this is not limited in this embodiment of the present application.

System CRC overheads can be reduced because CRC bit segments are attached, by code block group, to a plurality of code blocks obtained after the input sequence is processed. In addition, when ACK feedback is performed by code block group, performance is better, and system efficiency is improved.

In a possible implementation, the input sequence is segmented into C input bit segments, and the C input bit segments are divided into G groups. In this case, code blocks including a corresponding input bit segment in one group are in one code block group. In other words, the C code blocks belong to the G code block groups.

In another possible implementation, the input sequence is divided into G bit groups, and each bit group is further segmented to obtain a total of C input bit segments. Code blocks including input bit segments in a same bit group are in one code block group, so that the C code blocks belong to the G code block groups.

In an embodiment of the present application, a quantity G of code block groups may be determined based on a maximum quantity M of code blocks included in one code block group, for example, G=⌈B/(M·Z−L)⌉, C=⌈(B+G·L)/Z⌉, G is an integer greater than 0 and less than or equal to C, M is an integer greater than 0, and ⌈C/G⌉≤M.

For example, B=92000, Z=6144, L=24, and M is 4. A first grouping result may be obtained: G=4 and C=15; in other words, four code block groups and 15 code blocks may be obtained based on the input sequence.

In another embodiment of the present application, a quantity G of code block groups may be determined based on a maximum quantity $G_{max}$ of code block groups, for example, G=min(⌈B/(Z−L)⌉, $G_{max}$), and $G_{max}$>0; and if G<$G_{max}$, C=G; or if G=$G_{max}$, C=⌈(B+G·L)/Z⌉.

For example, B=92000, Z=6144, L=24, and $G_{max}$ is 4. A second grouping result may be obtained: G=4 and C=15; in other words, four code block groups and 15 code blocks may be obtained based on the input sequence.

According to the foregoing embodiment, the G code block groups include at least one code block group which includes $C_9$ code blocks, where $C_9$=⌈C/G⌉. The G code block groups further include at least one code block group which includes $C_{10}$ code blocks, where $C_{10}$=⌊C/G⌋. A quantity of code block groups including $C_{10}$ code blocks is $G_2$=G·$C_9$−C, and a quantity of code block groups including $C_9$ code blocks is $G_1$C=G−$G_2$, so that code block quantities of the code block groups are balanced.

The first grouping result or the second grouping result in the foregoing example is used as an example. Therefore, $C_9$=4, $C_{10}$=3, there are three code block groups, each including four code blocks, and there is one code block group including three code blocks. The 15 code blocks are divided into four code block groups that separately include three code blocks, four code blocks, four code blocks, and four code blocks.

In the method in the foregoing embodiment, code block counts of any two of the code block groups obtained by grouping can differ by up to one, so that the code block groups tend to have consistent block error rates (BLER) and consistent leakage detection performance.

In another embodiment of the present application, to enable all code block groups to have balanced input bit segment length and balanced CRC bit segment lengths, the G code block groups include at least one code block group which includes $C_9$ code blocks, where $C_9$=⌈$P_1$/Z⌉, and $P_1$=⌈(B+G·L)/G⌉. The G code block groups further include at least one code block group which includes $C_{10}$ code blocks, where $C_{10}$=⌈$P_2$/Z⌉, $P_2$=⌊(B+G·L)/G⌋. A quantity of code block groups including $C_{10}$ code blocks is $G_4$ G·$P_1$−(B+G·L), and a quantity of code block groups including $C_9$ code blocks is $G_3$=G−$G_4$. A quantity G of code block groups may be determined based on a maximum quantity M of code blocks included in one code block group, for example, G=⌈B/(M·Z−L)⌉, or a quantity G of code block groups may be determined based on a maximum quantity $G_{max}$ of code block groups, for example, G=min(⌈B/(Z−L)⌉, $G_{max}$).

For example, B=92000, Z=6144, L=24, and M is 4. G=4, $P_1=P_2=23024$, $C_9=C_{10}=4$, each code block group includes four code blocks, and there are 16 code blocks in total.

In the method in the foregoing embodiment, quantities of valid information bits included in all the block groups obtained by grouping differ by up to one bit.

It can be learned from FIG. 8 that the input sequence whose length is B is segmented into C input bit segments based on a determined quantity of code blocks, a determined quantity of code block groups, and determined code block lengths, the C code blocks belong to the G code block groups, and a CRC bit segment whose length is L is attached to one code block in each code block group. Each of $G_2$ code block groups includes $C_{10}$ code blocks, and each of $G_1$ code block groups includes $C_9$ code blocks.

It should be noted that the foregoing descriptions are examples, and the examples do not constitute a limitation in the present application.

Optionally, in this manner, if the length of the input sequence meets B≤M·Z, G=1. A length of a CRC bit segment in the C code blocks is L=0; in other words, none of the code blocks includes the CRC bit segment. For code block segmentation, refer to FIG. 7, and details are not described herein again.

Figure 9:
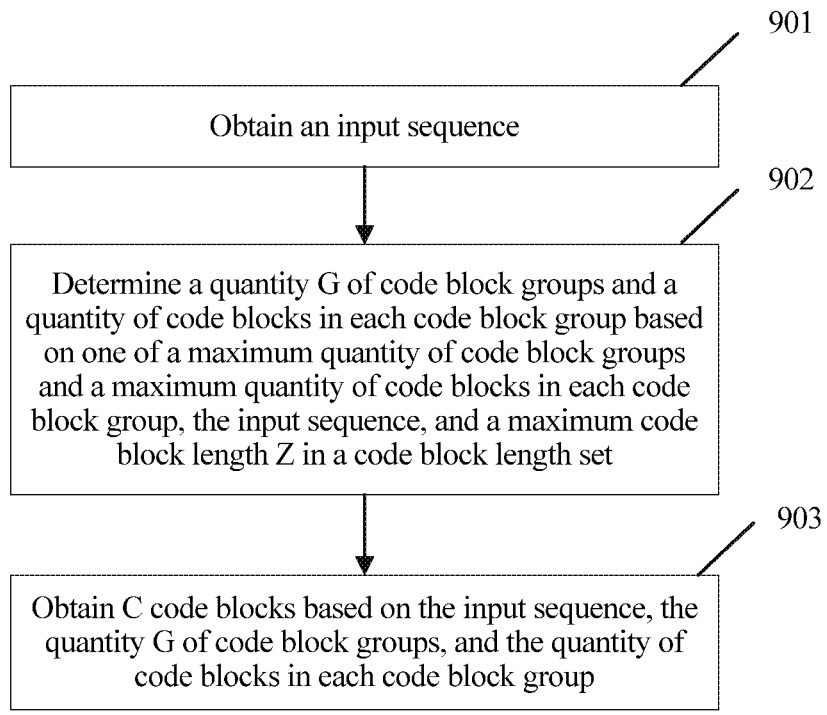
FIG. 9 is a flowchart of an information processing method according to another embodiment of the present application.

FIG. 9 is a flowchart of an information processing method in a communications system according to another embodiment of the present application. The method may be applied to a device at a transmitting end, and includes the following steps.

901. Obtain an input sequence, where a length of the input sequence is B.

902. Determine a quantity G of code block groups and a quantity of code blocks in each code block group based on one of a maximum quantity $G_{max}$ of code block groups and a maximum quantity M of code blocks in each code block group, the input sequence, and a maximum code block length Z in a code block length set.

For an implementation of obtaining G code block groups based on the maximum quantity $G_{max}$ of code block groups, the input sequence, and the maximum code block length Z, or obtaining G code block groups based on the maximum quantity M of code blocks in each code block group, the input sequence, and the maximum code block length Z, and determining the quantity of code blocks in each code block group, the foregoing segmentation implementations described in FIG. 8 may be referred to, and details are not described herein again.

903. Obtain C code blocks based on the input sequence, the quantity G of code block groups, and the quantity of code blocks in each code block group.

A quantity C of code blocks may be obtained based on the quantity G of code block groups and the quantity of code blocks in each code block group. The input sequence is segmented to C input bit segments, and each code block includes one of the input bit segments. Each code block group includes one code block to which a CRC bit segment is attached. A CRC bit segment in any code block group may be a parity bit segment generated for an input bit segment in at least one code block in the code block group, or may be a parity bit segment generated for an input bit segment and a filler bit segment in at least one code block in the code block group.

To ensure that the code blocks are balanced, lengths of the code blocks may be determined based on a length (B+G·L) of the input sequence to which G CRC bit segments are attached, and code block segmentation is performed based on the lengths of the code blocks.

For ease of description, in this embodiment of the present application, bits other than a filler bit segment included in each code block are referred to as a mixed segment. It can be learned that the mixed segment includes either an input bit segment, or, an input bit segment and a CRC bit segment. In one code block group, a mixed segment in only one code block includes the input bit segment and the CRC bit segment, and a mixed segment in another code block includes only the input bit segment.

At least one of the C code blocks includes a mixed segment whose length is $K_7$, and $K_7=\lceil(B+G·L)/C\rceil$.

The code block in which the mixed segment has the length of $K_7$ further includes a filler bit segment whose length is $F_7$, $F_7=I_7-K_7$, and $I_7$ is a minimum code block length in code block lengths greater than or equal to $K_7$ in the code block length set.

Further, at least one of the C code blocks includes a mixed segment whose length is $K_8$, $K_8=\lfloor(B+G·L)/C\rfloor$, and in the C code blocks, a quantity of code blocks including the mixed segment whose length is $K_8$ is $C_8=C·K_7-(B+G·L)$, and a quantity of code blocks including the mixed segment whose length is $K_7$ is $C_7=C-C_8$.

If (B+G·L) % C=0, and % represents a modulo operation, then $K_8=K_7$, and each of the C code blocks includes an input bit segment whose length is $K_7$ or the mixed segment whose length is $K_7$. In other words, there are C code blocks in which the mixed segment has the length of $K_7$.

The code block in which the mixed segment has the length of $K_8$ further includes a filler bit segment whose length is $F_8$, $F_8=I_8-K_8$, and $I_8$ is a minimum code block length in code block lengths greater than or equal to $K_8$ in the code block length set.

For example, B=92000, M=4, Z=6144, and L=24. In this case, a quantity of code block groups is $G=\lceil B/(M·Z-L)\rceil$, G=4, a quantity of code blocks is $C=\lceil(B+G·L)/Z\rceil$, and C=15. The 15 code blocks are divided into four code block groups that separately include three code blocks, four code blocks, four code blocks, and four code blocks. After balanced segmentation is performed, $K_7$ is 6140 bits, $K_8$ is 6139 bits, there are 11 code blocks in which the mixed segment has the length of $K_7$, and there are four code blocks in which the mixed segment has the length of $K_8$. A length of a filler bit segment in the code block in which the mixed segment has the length of $K_7$ is four bits, and a length of a filler bit segment in the code block in which the mixed segment has the length of $K_8$ is five bits. For example, a length of mixed segments in the 11 code blocks in groups 0 to 2 may be 6140 bits, and a length of mixed segments in the four code blocks in group 3 may be 6139 bits. Table 1 shows an example of a length of an input bit segment, a length of a CRC bit segment, and a length of a filler bit segment in each code block in this block segmentation manner. Certainly, a length of mixed segments in code blocks 0 to 3 may be 6139 bits, and a length of mixed segments in code blocks 4 to 14 may be 6140 bits.

TABLE 1

An Example of Code Block Segmentation

| Group number | Code block number | Length (bits) of an input bit segment | Length (bits) of a CRC bit segment | Length (bits) of a filler bit segment |
|---|---|---|---|---|
| 0 | 0 | 6140 | 0 | 4 |
|   | 1 | 6140 | 0 | 4 |
|   | 2 | 6116 | 24 | 4 |
| 1 | 3 | 6140 | 0 | 4 |

TABLE 1-continued

An Example of Code Block Segmentation

| Group number | Code block number | Length (bits) of an input bit segment | Length (bits) of a CRC bit segment | Length (bits) of a filler bit segment |
|---|---|---|---|---|
| | 4 | 6140 | 0 | 4 |
| | 5 | 6140 | 0 | 4 |
| | 6 | 6116 | 24 | 4 |
| 2 | 7 | 6140 | 0 | 4 |
| | 8 | 6140 | 0 | 4 |
| | 9 | 6140 | 0 | 4 |
| | 10 | 6116 | 24 | 4 |
| 3 | 11 | 6139 | 0 | 5 |
| | 12 | 6139 | 0 | 5 |
| | 13 | 6139 | 0 | 5 |
| | 14 | 6115 | 24 | 5 |

It should be noted that the foregoing descriptions are examples, and the examples do not constitute a limitation.

CRC bits are attached by code block group, so that CRC check overheads can be reduced, and system performance can be further improved. If a hybrid automatic repeat request (HARQ) is used in a system to feed back acknowledgement/negative acknowledgement (ACK/NACK) information by group, CRC attachment based on the code block group can reduce feedback signaling overheads and improve system transmission efficiency.

According to the information processing methods in the foregoing embodiments, a communications device 10 may further encode each of the C code blocks to obtain coded blocks. The communications device 10 may encode each code block in a channel coding scheme used in the system, to be specific, perform encoding by using each output sequence $c_{r0}$, $c_{r1}$, $c_{r2}$, $c_{r3}$, L, $c_{r(K_r-1)}$ in step 202 as an input sequence for an encoder, for example, perform LDPC coding or polar coding. This is not limited thereto. After encoding the code block, the communications device 10 sends the coded block to a device at a receiving end.

Figure 10:
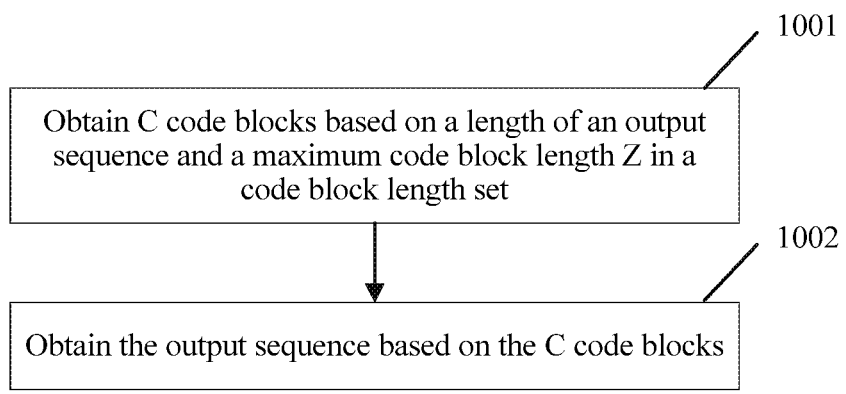
FIG. 10 is a flowchart of an information processing method according to another embodiment of the present application.

FIG. 10 shows an information processing method in a communications system according to another embodiment of the present application. The method may be applied to a device at a receiving end. As shown in FIG. 10, the method includes the following steps.

1001. Obtain C code blocks based on a length of an output sequence and a maximum code block length Z in a code block length set.

In the embodiments of the present application, the output sequence may be a transport block or a transport block to which transport block CRC is attached. The transport block herein may be obtained by performing block segmentation on an information sequence based on a transport block size, and is configured to transmit control information or data information. The transport block or the transport block to which the transport block CRC is attached that is obtained by the device at the receiving end based on the received code blocks may be used as the output sequence for code block concatenation. Because a process performed by a device at a transmitting end and a process performed by the device at the receiving end are inverse to each other, the output sequence on which the device at the receiving end performs code block concatenation is equivalent to an input sequence on which the transmitting end device performs code block segmentation.

A communications device 11 may obtain a received transport block size, namely, the length of the output sequence, and obtain the maximum code block length Z in the code block length set, to determine a quantity C of code blocks in the output sequence.

The communications device 11 receives C coded blocks sent by a communications device 10, and obtains the C code blocks after a decoder decodes the C coded blocks.

1002. Obtain the output sequence based on the C code blocks obtained in step 1001.

Each code block includes an output bit segment in the output sequence, and at least one code block includes a cyclic redundancy check CRC bit segment whose length is L, or includes a filler bit segment. B, Z, and C are integers greater than 0, and L is an integer greater than or equal to 0 and less than Z.

In step 1001, in addition to determining the quantity of code blocks, the communications device 11 may determine lengths of the code blocks, a length of the output bit segment in the code block, the length L of the CRC bit segment, and a length of the filler bit segment. For details, refer to examples of code block segmentation in the embodiments shown in FIG. 5 to FIG. 8, and the examples describe how to determine the quantity of code blocks, a length of a code block, a length L of a CRC bit segment, and a length of a filler bit segment. Details are not described herein again. The communications device 11 obtains output bit segments from the code blocks, and then concatenates the output bit segments to obtain the output sequence.

In addition to the output bit segment, the code block includes the CRC bit segment whose length is L. If the CRC bit segment is a parity bit segment generated for the output bit segment in the code block, the communications device 11 checks the output bit segment in the code block based on the CRC bit segment. If the check succeeds, the communications device 11 determines that the output bit segment in the code block is correct and may be further concatenated to another output bit segment that passes the check. If the CRC bit segment is a parity bit segment generated for the output bit segment and the filler bit segment in the code block, the communications device 11 checks the output bit segment and the filler bit segment in the code block based on the CRC bit segment. If the check succeeds, the communications device 11 determines that the output bit segment and the filler bit segment in the code block are correct, and further concatenates the output bit segment in the code block to another output bit segment that passes the check. If the CRC bit segment is a parity bit segment generated for output bit segments in a plurality of code blocks, the communications device 11 checks the output bit segments in these code blocks based on the CRC bit segment. If the check succeeds, the communications device 11 concatenates these output bit segments to another output bit segment that passes the check. If the CRC bit segment is a parity bit segment generated for output bit segments and filler bit segments in a plurality of code blocks, the communications device 11 checks the output bit segments and the filler bit segments in these code blocks based on the CRC bit segment. If the check succeeds, the communications device 11 concatenates these output bit segments to another output bit segment that passes the check.

The method performed by the communications device 11 is an inverse process performed by the communications device 10. For a quantity of code blocks, a length of the code block, a length of the filler bit segment, and attachment of the CRC bit segment, refer to examples of code block segmentation described in FIG. 5 to FIG. 8. The only difference is that the output sequence and the output bit segment for the communications device 11 are corresponding to the input sequence and the input bit segment for the communications device 10. Because information processing methods and effects have been described in the foregoing embodiments, details are not described herein again.

Figure 11:
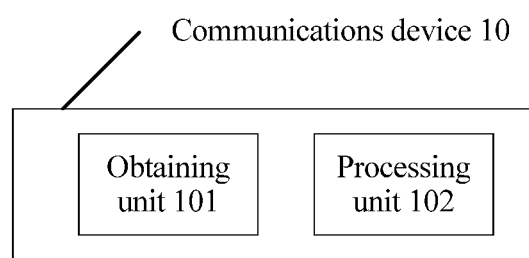
FIG. 11 is a simplified block diagram of the communications device 10 shown in FIG. 1.

FIG. 11 is a block diagram of the communications device 10 shown in FIG. 1. The communications device 10 includes an obtaining unit 101 and a processing unit 102.

The obtaining unit 101 is configured to obtain an input sequence. The processing unit 102 is configured to obtain C code blocks based on the input sequence and a maximum code block length Z in a code block length set. Each of the code blocks includes an input bit segment in the input sequence, at least one of the code blocks includes a cyclic redundancy check CRC bit segment whose length is L, or includes a filler bit segment, B, Z, and C are integers greater than 0, and L is an integer greater than or equal to 0 and less than Z. The communications device may be configured to implement the foregoing method embodiments. Refer to the description in the foregoing method embodiments, and details are not described herein again.

The communications device 10 may further include an encoding unit 103 (not shown in FIG. 11). The encoding unit 103 may also be referred to as an encoder, an encoding circuit, or the like, and is mainly configured to encode the code blocks output by the processing unit 102, for example, perform LDPC coding on each of the C code blocks in the foregoing embodiment.

The communications device 10 may further include a transceiver unit 104 (not shown in FIG. 11), and the transceiver unit 104 may also be referred to as a transceiver, a transceiver circuit, or the like. The transceiver unit 104 is mainly configured to transmit and receive a radio frequency signal, for example, is configured to send, to the communications device 11, a coded block that is coded by the encoding unit 103.

The communications device 10 may further include another unit, for example, a unit configured to generate transport block CRC, a rate matching unit, an interleaving unit, and a modulation unit, which may be separately configured to implement corresponding functions.

It should be noted that the communications device 10 may include one or more memories and processors to implement functions of the communications device. The memory and the processor may be disposed on each unit. Alternatively, a plurality of units may share a same memory and a same processor.

Figure 12:
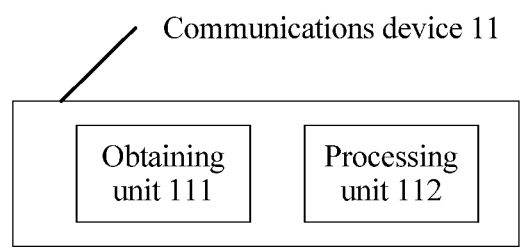
FIG. 12 is a simplified block diagram of the communication device 11 shown in FIG. 1.

FIG. 12 is a block diagram of a communications device 11 shown in FIG. 1. The communications device 11 includes an obtaining unit 111 and a processing unit 112.

The obtaining unit 111 is configured to obtain C code blocks based on a length of an output sequence and a maximum code block length Z in a code block length set.

The processing unit 112 is configured to obtain the output sequence based on the C code blocks obtained by the obtaining unit 111, where each of the code blocks includes an output bit segment in the output sequence, at least one of the code blocks includes a cyclic redundancy check CRC bit segment whose length is L, or includes a filler bit segment, B, Z, and C are integers greater than 0, and L is an integer greater than or equal to 0 and less than Z.

The obtaining unit 111 and the processing unit 112 may be configured to implement the method in the foregoing method embodiments. For details, refer to the description in the foregoing method embodiments, and details are not described herein again.

The communications device 11 may further include a decoding unit 113 (not shown in FIG. 12). The decoding unit 113 may also be referred to as a decoder, a decoding circuit, or the like, and is mainly configured to decode coded blocks received by a transceiver unit 114 (not shown in FIG. 12).

The communications device 11 may further include the transceiver unit 114, and the transceiver unit 114 may also be referred to as a transceiver, a transceiver circuit, or the like. The transceiver unit 114 is mainly configured to transmit and receive a radio frequency signal, for example, is configured to receive a coded block that is sent by the communications device 10 and that is in the foregoing method embodiments.

The communications device 11 may further include another unit, for example, a unit configured to perform transport block CRC, a de-rate matching unit, a de-interleaving unit, and a demodulation unit, which may be separately configured to implement corresponding functions of the communications device.

It should be noted that the communications device 11 may include one or more memories and processors to implement functions of the communications device. The memory and the processor may be disposed on each unit. Alternatively, a plurality of units may share a same memory and a same processor.

Various illustrative logical blocks and steps that are listed in the embodiments of the present application may be implemented by using electronic hardware, computer software, or a combination thereof. Whether the functions are implemented by using hardware or software depends on particular applications and a design requirement of an entire system. Various methods may be used to implement the described functions for each particular application, but it should not be considered that the implementation goes beyond the scope of the embodiments of the present application.

The various illustrative logical units and circuits described in the embodiments of the present application may implement or operate the described functions by using a general purpose processor, a digital signal processor, an application-specific integrated circuit (ASIC), a field programmable gate array (FPGA) or another programmable logical apparatus, a discrete gate or transistor logic, a discrete hardware component, or a design of any combination thereof. The general purpose processor may be a microprocessor. Optionally, the general purpose processor may also be any conventional processor, controller, microcontroller, or state machine. The processor may alternatively be implemented by a combination of computing apparatuses, such as a digital signal processor and a microprocessor, a plurality of microprocessors, one or more microprocessors together with a digital signal processor core, or any other similar configuration.

Steps of the methods or algorithms described in the embodiments of the present application may be directly embedded into hardware, a software unit executed by the processor, or a combination thereof. The software unit may be stored in a RAM memory, a flash memory, a ROM memory, an EPROM memory, an EEPROM memory, a register, a hard disk, a removable magnetic disk, a CD-ROM, or a storage medium of any other form in the art. For example, the storage medium may connect to the processor, so that the processor may read information from the storage medium and write information to the storage medium. Alternatively, the storage medium may be integrated into the processor. The processor and the storage medium may be arranged in an ASIC, and the ASIC may be arranged in a terminal device or a network device. Optionally, the processor and the storage medium may be arranged in different components of the terminal device or the network device.

When the present application is implemented by software, the foregoing functions may be stored in a computer-readable medium or transmitted as one or more instructions or code in the computer-readable medium. The computer-readable medium includes a computer storage medium as described above. In addition, any connection may be appropriately defined as a computer-readable medium. For example, if software is transmitted from a website, a server, or another remote source by using a coaxial cable, an optical fiber/cable, a twisted pair, a digital subscriber line (DSL), or wireless technologies such as infrared ray, radio and microwave, the coaxial cable, optical fiber/cable, twisted pair, DSL or wireless technologies such as infrared ray, radio and microwave are included in fixation of a medium to which they belong.

In summary, what is described above is merely example embodiments of the technical solutions of the present application, but is not intended to limit the protection scope of the present application. Any modification, equivalent replacement, or improvement made without departing from the spirit and principle of the present application shall fall within the protection scope of the present application.

What is claimed is:

1. An information processing method in a communication system, comprising:
   obtaining, by a communication device, an input sequence, wherein the input sequence comprises a quantity B of bits, and B≥1;
   transforming, by the communication device, the input sequence into a quantity C of code blocks, wherein C is an integer greater than or equal to 1;
   encoding, by the communication device, each of the C code blocks using a low-density parity-check (LDPC) base matrix, to obtain C encoded code blocks; and
   transmitting, by the communication device, further processed C encoded code blocks to another communication device;
wherein each of the C code blocks has a code block length less than or equal to a maximum code block length of Z bits;
wherein each of the C code blocks comprises a segment of the input sequence and a quantity L of cyclic redundancy check (CRC) bits corresponding to the segment of the input sequence;
wherein L is greater than or equal to 0;
wherein, when B>Z, the quantity of code blocks C is determined by:

$$C = \lceil B/(Z-L) \rceil,$$

where $\lceil x \rceil$ represents rounding number x to upper integer;
wherein at least one of the C code blocks comprises a quantity $K_3$ of bits, $K_3$ is a combined length of the segment of the input sequence and the L CRC bits, and $K_3$ is determined by:

$$K_3 = \lceil (B+C \cdot L)/C \rceil;$$

wherein each code block comprising $K_3$ bits further comprises a quantity $F_3$ of filler bit(s), $F_3$ is greater than 0, and $$F_3 + K_3 = I_3,$$

where $I_3$ is a product of a lifting factor z and a value X;
wherein X is quantity of information-bit-columns in the LDPC base matrix; and
wherein the lifting factor z is a minimum value in lifting factors greater than or equal to $\lceil K_3/X \rceil$.

2. The method according to claim 1, wherein when (B+C·L) is divisible by C, each of the C code blocks comprises $K_3$ bits.

3. The method according to claim 2,
wherein $K_3$ is a combined length of the segment of the input sequence and the L CRC bits, and $K_3$ is determined by:

$$K_3 = (B+C \cdot L)/C.$$

4. The method according to claim 1,
wherein the lifting factor z is a minimum lifting factor that makes $I_3$ meet $I_3 \geq K_3$.

5. The method according to claim 1, wherein in the code block(s) comprising $K_3$ bits, the $F_3$ filler bit(s) is/are placed after the L CRC bits.

6. The method according to claim 1,
wherein at least one of the C code blocks comprises a quantity $K_4$ of bits, $K_4$ is a combined length of the segment of the input sequence and the L CRC bits, and $K_4$ is determined by:

$$K_4 = \lfloor (B+C \cdot L)/C \rfloor,$$

where $\lfloor x \rfloor$ represents rounding number x to lower integer.

7. The method according to claim 6, wherein the code block(s) comprising $K_4$ bits further comprise(s) a quantity $F_4$ of filler bit(s), $F_4$ is greater than 0, and $$F_4 + K_4 = I_4,$$

wherein $I_4$ is a minimum value of code block lengths greater than $K_4$ in a code block length set.

8. The method according to claim 6, wherein the code block(s) comprising $K_4$ bits further comprise(s) a quantity $F_4$ of filler bit(s), $F_4$ is greater than 0, and $$F_4 + K_4 = I_4,$$

wherein $I_4$ is a product of a lifting factor z and a value X;
wherein the lifting factor z is a minimum value in lifting factors greater than or equal to $\lceil K_4/X \rceil$.

9. The method according to claim 6, wherein the code block(s) comprising $K_4$ bits further comprise(s) a quantity $F_4$ of filler bit(s), $F_4$ is greater than 0, and $$F_4 + K_4 = I_4,$$

wherein $I_4$ is a product of a lifting factor z and a value X; and
wherein the lifting factor z is a minimum lifting factor that makes $I_4$ meet $I_4 \geq K_4$.

10. The method according to claim 1, wherein L=24.

11. The method according to claim 1, wherein when B≤Z, C=1.

12. The method according to claim 1, wherein when B≤Z, C=1 and L=0.

13. An apparatus, comprising:
   a memory configured to store program instructions; and
   a processor coupled to the memory and configured to execute the program instructions;
wherein, when executed by the processor, the program instructions cause the apparatus to:
   obtain an input sequence, wherein the input sequence comprises a quantity B of bits, and B≥1;
   transform the input sequence into a quantity C of code blocks, wherein C is an integer greater than or equal to 1;
   encode each of the C code blocks using a low-density parity-check (LDPC) base matrix, to obtain C encoded code blocks; and
   transmit further processed C encoded code blocks to another communication device;
wherein each of the C code blocks has a code block length less than or equal to a maximum code block length of Z bits;

wherein each of the C code blocks comprises a segment of the input sequence and a quantity L of cyclic redundancy check (CRC) bits corresponding to the segment of the input sequence;

wherein L is greater than or equal to 0;

wherein when B>Z, the quantity of code blocks C is determined by:

$$C=\lceil B/(Z-L) \rceil,$$

where $\lceil x \rceil$ represents rounding number x to upper integer;

wherein at least one of the C code blocks comprises a quantity $K_3$ of bits, $K_3$ is a combined length of the segment of the input sequence and the L CRC bits, and $K_3$ is determined by:

$$K_3=\lceil (B+C \cdot L)/C \rceil;$$

wherein each code block comprising $K_3$ bits further comprises a quantity $F_3$ of filler bit(s), $F_3$ is greater than 0, and $$F_3+K_3=I_3,$$

where $I_3$ is a product of a lifting factor z and a value X; wherein X is quantity of information-bit-columns in the LDPC base matrix; and wherein the lifting factor z is a minimum value in lifting factors greater than or equal to $\lceil K_3/X \rceil$.

14. The apparatus according to claim 13, wherein when (B+C·L) is divisible by C, each of the C code blocks comprises $K_3$ bits.

15. The apparatus according to claim 14, wherein $K_3$ is a combined length of the segment of the input sequence and the L CRC bits, and $K_3$ is determined by:

$$K_3=(B+C \cdot L)/C.$$

16. The apparatus according to claim 13, wherein the lifting factor z is a minimum lifting factor that makes $I_3$ meet $I_3 \geq K_3$.

17. The apparatus according to claim 13, wherein in the code block(s) comprising $K_3$ bits, the $F_3$ filler bit(s) is/are placed after the L CRC bits.

18. The apparatus according to claim 13, wherein at least one of the C code blocks comprises a quantity $K_4$ of bits, $K_4$ is a combined length of the segment of the input sequence and the L CRC bits, and $K_4$ is determined by:

$$K_4=\lfloor (B+C \cdot L)/C \rfloor,$$

where $\lfloor x \rfloor$ represents rounding number x to lower integer.

19. The apparatus according to claim 18, wherein the code block(s) comprising $K_4$ bits further comprise(s) a quantity $F_4$ of filler bit(s), $F_4$ is greater than 0, and $$F_4+K_4=I_4,$$

wherein $I_4$ is a minimum value of code block lengths greater than $K_4$ in a code block length set.

20. The apparatus according to claim 18, wherein the code block(s) comprising $K_4$ bits further comprise(s) a quantity $F_4$ of filler bit(s), $F_4$ is greater than 0, and $$F_4+K_4=I_4,$$

wherein $I_4$ is a product of a lifting factor z and a value X; and wherein the lifting factor z is a minimum value in lifting factors greater than or equal to $\lceil K_4/X \rceil$.

21. The apparatus according to claim 18, wherein the code block(s) comprising $K_4$ bits further comprise(s) a quantity $F_4$ of filler bit(s), $F_4$ is greater than 0, and $$F_4+K_4=I_4,$$

wherein $I_4$ is a product of a lifting factor z and a value X; and wherein the lifting factor z is a minimum lifting factor that makes $I_4$ meet $I_4 \geq K_4$.

22. The apparatus according to claim 13, wherein L=24.

* * * * *